United States Patent
Kim

(10) Patent No.: US 7,157,957 B2
(45) Date of Patent: Jan. 2, 2007

(54) HIGH VOLTAGE SWITCH CIRCUIT FOR SEMICONDUCTOR DEVICE

(75) Inventor: Doe Cook Kim, Daegu-Shi (KR)

(73) Assignee: Hynix Semiconductor Inc., Ichon-Shi (KR)

( * ) Notice: Subject to any disclaimer, the term of this patent is extended or adjusted under 35 U.S.C. 154(b) by 198 days.

(21) Appl. No.: 11/006,729

(22) Filed: Dec. 8, 2004

(65) Prior Publication Data

US 2005/0184792 A1   Aug. 25, 2005

(30) Foreign Application Priority Data

Feb. 25, 2004  (KR) .................. 10-2004-0012705

(51) Int. Cl.
*H03K 17/16*   (2006.01)

(52) U.S. Cl. .................. 327/390; 327/404; 327/427

(58) Field of Classification Search ............... 327/390, 327/403, 404; 326/88
See application file for complete search history.

(56) References Cited

U.S. PATENT DOCUMENTS

| 6,864,738 | B1* | 3/2005 | Du et al. ............... 327/536 |
| 7,030,684 | B1* | 4/2006 | Kim ..................... 327/390 |
| 7,053,689 | B1* | 5/2006 | Kim ..................... 327/390 |

* cited by examiner

*Primary Examiner*—Long Nguyen
(74) *Attorney, Agent, or Firm*—Mayer, Brown, Rowe & Maw LLP

(57) ABSTRACT

Provided is concerned with a high voltage switch circuit for a semiconductor device, which rapidly discharges a gate voltage of a pass transistor through an additional discharge transistor during inactivation of itself in the circuit structure with a positive feedback loop for transferring an internal high voltage without a voltage drop by applying an enough voltage to the gate of the pass transistor. The high voltage switch circuit prevents the internal high voltage from decreasing.

3 Claims, 1 Drawing Sheet

HIGH VOLTAGE SWITCH CIRCUIT FOR SEMICONDUCTOR DEVICE

BACKGROUND

1. Field of the Invention

The present invention is related to a high voltage switch circuit of a semiconductor device and particularly, to a high voltage switches circuit capable of rapidly discharging a high voltage.

2. Discussion of Related Art

A semiconductor device needs a high voltage pumped over an input power supply voltage, in which a high voltage transfer switch is required to pass the high voltage. In a conventional NAND flash memory, a pumping bias voltage is transferred to a wordline as a target voltage during a program operation or a read operation, for which a gate bias is boosted up from a floating state with a coupling level at a junction of a pass transistor by applying a bias voltage to the junction of the pass transistor at a time and thereby the wordline is charged with the bias voltage without a voltage drop.

However, after transferring the target bias voltage, the gate voltage of the pass transistor gradually decreases for discharging the bias voltage, so that the high voltage generated internally (i.e., applied to the pass transistor) drops when the voltage level transferred goes to a logical low. Further, relative to a higher frequency operation in a semiconductor device, such a discharging time for the bias voltage increases to cause a disadvantage for the device.

SUMMARY OF THE INVENTION

The present invention is directed to a high voltage switch circuit of a semiconductor device, which is able to rapidly discharge a capacitor coupled to a gate of a pass transistor by means of an additional discharge transistor therein.

One aspect of the present invention is to provide a high voltage switch circuit of a semiconductor device, including a control node from which a control voltage is generated, a first transistor transferring a first high voltage in response to the control voltage, an input circuit transferring a predetermined precharge voltage to the control node in response to a switch control signal, a positive feedback loop transferring a second high voltage to the control node in response to the control voltage, first and second capacitors boosting a voltage of the control node and the second high voltage of the positive feedback loop, respectively, and a second transistor connected to the control node and discharging the control voltage Vg in response to the switch control signal.

Preferably, the input circuit includes a third transistor serially connected between the control node and an input terminal of the switch control signal, being driven by a power supply voltage.

Preferably, the positive feedback loop includes fourth and fifth transistors serially connected between the control node and an input terminal of the second high voltage, being driven each by the control voltage and the second high voltage boosted by the second capacitor, and first and second diodes connected between the control node and the input terminal of the second high voltage, adjusting a level of the control voltage.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention. In the drawings.

DETAILED DESCRIPTION OF PREFERRED EMBODIMENTS

Figure 1:
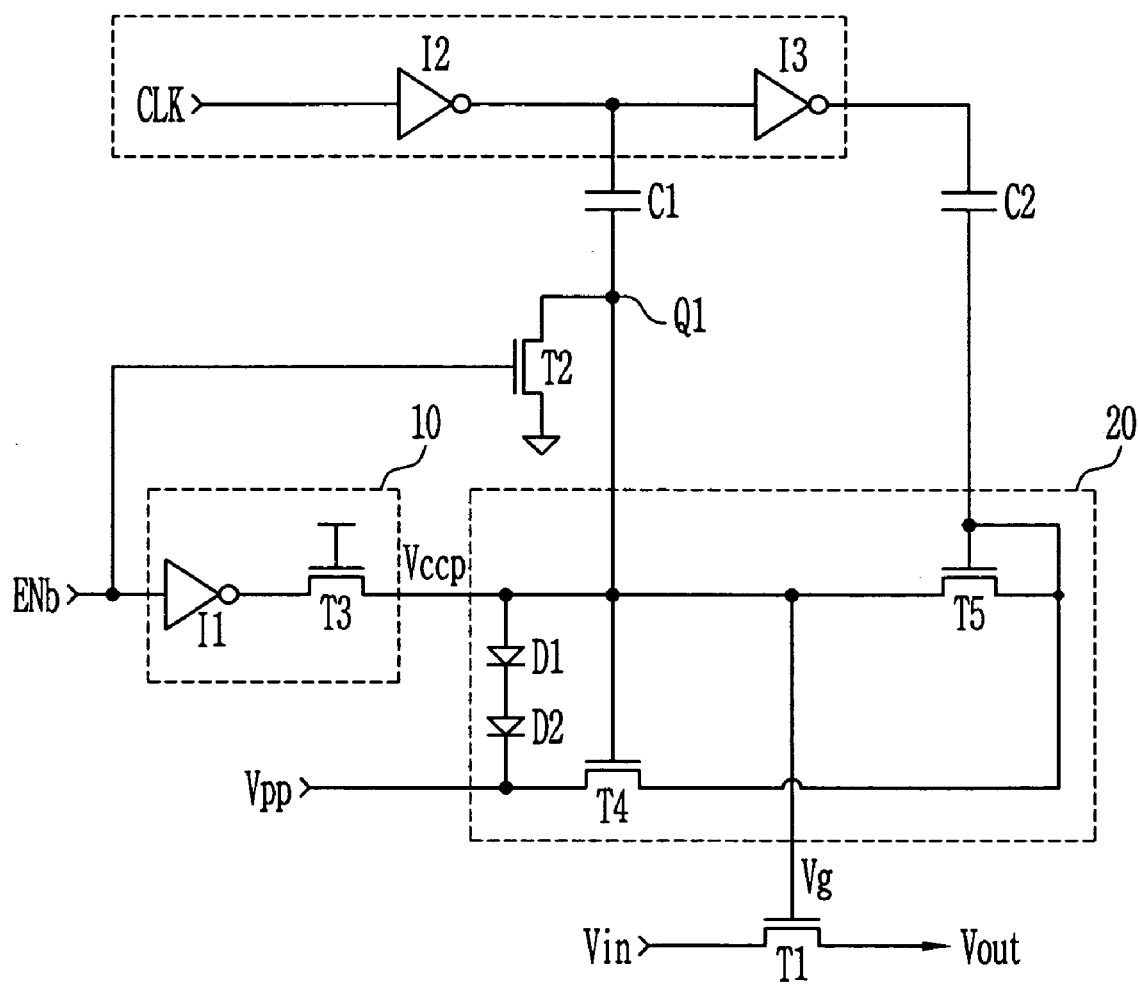
FIG. 1 is a circuit diagram of a high voltage switch circuit for a semiconductor device in accordance with the present invention.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the invention to those skilled in the art. Like numerals refer to like elements throughout the specification.

Hereinafter, it will be described about an exemplary embodiment of the present invention in conjunction with the accompanying drawings.

FIG. 1 is a circuit diagram of a high voltage switch circuit for a semiconductor device in accordance with the present invention.

Referring to FIG. 1, the high voltage switch circuit is comprised of a control node Q1 from which a control voltage Vg is generated, a first transistor T1 transferring a first high voltage Vin in response to the control voltage Vg, an input circuit 10 transferring a predetermined precharge voltage Vccp to the control node Q1 in response to a switch control signal ENb, a positive feedback loop 20 transferring a second high voltage Vpp to the control node Q1 in response to the control voltage Vg, first and second capacitors, C1 and C2, each boosting a voltage of the control node Q1 and the second high voltage Vpp of the positive feedback loop 20, and a second transistor T2 connected to the control node Q1 and discharging the control voltage Vg in response to the switch control signal ENb.

The input circuit 10 includes a third transistor T3 serially connected between the control node Q1 and an input terminal of the switch control signal ENb, which is driven by a power supply voltage Vcc.

The positive feedback loop 20 includes fourth and fifth transistors serially connected between the control node Q1 and an input terminal of the second high voltage Vpp, which are driven each by the control voltage Vg and the second high voltage Vpp boosted by the second capacitor C2. The positive feedback loop 20 further includes first and second diodes, D1 and D2, connected between the control node Q1 and the input terminal of the second high voltage Vpp, adjusting a level of the control voltage Vg.

The positive feedback loop 20 may further include a second inverter I2 connected between an input terminal of a clock signal CLK and the first capacitor C1 and inversing a logic level of the clock signal CLK, and a third inverter connected between an output terminal of the second inverter I2 and the second capacitor C2 and inversing a logic level of the inverted clock signal.

It is preferred for the second transistor T2 to use a high voltage NMOS transistor capable of rapidly driving a discharge operation for the control voltage Vg. The first and second high voltages, Vin and Vpp, may be used in the same voltage level.

Now, it will be described about an operation the high voltage switch circuit with the aforementioned structure.

In order to make the high voltage switch active, it supplies the high voltage switch control signal ENb of a logical low, and the first high voltage Vin, and the second high voltage Vpp to the high voltage switch.

Then, the precharge voltage Vccp of the power supply voltage level is applied to the control node Q1 by means of the first inverter I1 and the third transistor T3. The precharge voltage Vccp applied to the control node Q1 turns the fourth transistor T4 on to supply the second high voltage Vpp to gate and drain terminals of the fifth transistor T5. There may be a voltage drop by a threshold voltage of the fourth transistor T4. The second high voltage Vpp applied to the gate terminal of the fifth transistor T5 is pumped up by the second capacitor C2. Therefore, the fifth transistor T5 supplied with the second high voltage Vpp pumped through its gate terminal transfers the second high voltage Vpp to the control node Q1 from the fourth transistor T4 without a voltage drop. The second high voltage Vpp applied to the control node Q1 is added to the precharge voltage Vccp and then pulped up by the first capacitor C1. At this time, the pumped voltage is applied to the gate terminal of the fourth transistor T4. Thus, a voltage of the gate terminal of the fourth transistor T4 increases to reduce a voltage drop during a transfer operation for the second high voltage Vpp. The fourth transistor T4 transfers the second high voltage Vpp to the fifth transistor T5 with a reduced voltage drop and the fifth transistor T5 transfers the second high voltage Vpp to the control node Q1, forming a continuous loop. The first and second capacitors C1 and C2 prosecute a boosting operation in response to the clock signal to raise a voltage of the control node Q1 and a voltage applied to the gate terminal of the fifth transistor T5. As a result, such a boosting operation with the feedback loop enables the control voltage Vg of the control node Q1 gradually increase up to Vpp+Vt. In the positive feedback loop 20 according to the present invention, the first and second diodes, D1 and D2, contribute to prevent the control voltage Vg of the control node Q1 from increasing to the voltage level of Vpp+2 Vt.

Meantime, the first transistor T1 driven by the control voltage Vg of the control node Q1 gradually switches the first high voltage Vin while the control voltage Vg is increasing and transfers the first high voltage Vin without a voltage drop when the control voltage Vg reaches Vpp+Vt.

As stated above, in order to terminate the high voltage switching operation after transferring the high voltage, the high voltage switch control signal ENb goes to a logic high and then applied to the high voltage switch.

Thereby, the operation of the positive feedback loop is terminated and the second transistor T2 is turned on to quickly discharge the control voltage Vg held at the control node T2. During this, there may be a discharging effect by the third transistor T3 and the first inverter I1 of the input circuit 10.

As a result, it prevents the first high voltage Vin, which is generated from an internal pumping operation, from a voltage drop even when the first high voltage Vin transferred by the first transistor T1 becomes a ground level (Vout=GND). The voltage drop of the first high voltage Vin is caused from the fact that it is impossible to design the third transistor T3 and the first inverter I1 with enough sizes although the first and second capacitors, C1 and C2, have large capacitance. However, the present invention employs an additional discharge transistor to rapidly discharge the gate voltage of the pass transistor when the high voltage switch is being disabled.

As described above, the present invention uses the positive feedback loop to supply an enough control voltage to the gate terminal of the pass transistor, transferring the internally generated high voltage without a voltage drop.

Moreover, an additional discharge transistor is able to rapidly discharge the gate voltage of the pass transistor when the switch is being disabled, preventing the pumping voltage from decreasing.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

What is claimed is:

1. A high voltage switch circuit of a semiconductor device, said high voltage switch circuit comprising:
    a control node from which a control voltage signal is generated;
    a first transistor transferring a first high voltage signal in response to the control voltage signal;
    an input circuit transferring a predetermined precharge voltage to the control node in response to a switch control signal;
    a positive feedback loop transferring a second high voltage to the control node in response to the control voltage signal;
    first and second capacitors for boosting a voltage of the control voltage signal and the second high voltage of the positive feedback loop, respectively; and
    a second transistor connected to the control node and discharging the control voltage signal in response to the switch control signal.

2. The high voltage switch circuit according to claim 1, wherein the input circuit is comprised of a third transistor serially connected between the control node and an input terminal receiving the switch control signal, the third transistor being driven by a power supply voltage.

3. The high voltage switch circuit according to claim 1, wherein the positive feedback loop comprises:
    fourth and fifth transistors serially connected between the control node and an input terminal of the second high voltage, wherein said fourth and fifth transistors being driven by the control voltage signal and the second high voltage boosted by the second capacitor, respectively; and
    first and second diodes connected between the control node and the input terminal receiving the second high voltage for adjusting the voltage of the control voltage control signal.

* * * * *